(12) United States Patent
Ewe et al.

(10) Patent No.: US 10,020,245 B2
(45) Date of Patent: Jul. 10, 2018

(54) LAMINATE ELECTRONIC DEVICE

(71) Applicant: Infineon Technologies AG, Neubiberg (DE)

(72) Inventors: Henrik Ewe, Burglengenfeld (DE); Joachim Mahler, Regensburg (DE); Anton Prueckl, Schierling (DE); Stefan Landau, Wehrheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/150,795

(22) Filed: Jan. 9, 2014

(65) Prior Publication Data

US 2014/0117565 A1     May 1, 2014

Related U.S. Application Data

(62) Division of application No. 12/628,428, filed on Dec. 1, 2009, now Pat. No. 8,864,043.

(51) Int. Cl.
*H01L 23/48* (2006.01)
*H01L 23/538* (2006.01)
(Continued)

(52) U.S. Cl.
CPC ........ *H01L 23/481* (2013.01); *H01L 23/5389* (2013.01); *H01L 24/24* (2013.01); *H01L 24/82* (2013.01); *H01L 25/0655* (2013.01); *H01L 25/18* (2013.01); *H05K 1/185* (2013.01); *H01L 21/56* (2013.01); *H01L 21/6835* (2013.01); *H01L 23/3107* (2013.01); *H01L 2221/68372* (2013.01); *H01L 2221/68377* (2013.01);
(Continued)

(58) Field of Classification Search
CPC ... H01L 23/481; H01L 24/82; H01L 25/0655; H01L 23/5389; H05K 1/185
USPC .......... 438/106, 110; 257/E23.063, E21.502, 257/E21.499
See application file for complete search history.

(56) References Cited

U.S. PATENT DOCUMENTS

| 5,200,362 A | 4/1993 | Lin et al. |
| 6,238,952 B1 | 5/2001 | Lin |

(Continued)

FOREIGN PATENT DOCUMENTS

| DE | 10 2007 017 831 | 10/2008 |
| WO | 01/37338 | 5/2001 |

OTHER PUBLICATIONS

Non-Final Office Action mailed Jul. 29, 2011 in U.S. Appl. No. 12/628,428.
(Continued)

*Primary Examiner* — David Vu
(74) *Attorney, Agent, or Firm* — Dicke, Billig & Czaja, PLLC

(57) ABSTRACT

A method of manufacturing a laminate electronic device is disclosed. One embodiment provides a carrier, the carrier defining a first main surface and a second main surface opposite to the first main surface. The carrier has a recess pattern formed in the first main surface. A first semiconductor chip is attached on one of the first and second main surface. A first insulating layer overlying the main surface of the carrier on which the first semiconductor chip is attached and the first semiconductor chip is formed. The carrier is then separated into a plurality of parts along the recess pattern.

20 Claims, 11 Drawing Sheets

(51) Int. Cl.
*H01L 23/00* (2006.01)
*H01L 25/065* (2006.01)
*H01L 25/18* (2006.01)
*H05K 1/18* (2006.01)
*H01L 21/56* (2006.01)
*H01L 21/683* (2006.01)
*H01L 23/31* (2006.01)
*H05K 1/05* (2006.01)
*H05K 3/46* (2006.01)

(52) U.S. Cl.
CPC ............... *H01L 2224/0557* (2013.01); *H01L 2224/24137* (2013.01); *H01L 2224/2518* (2013.01); *H01L 2224/76155* (2013.01); *H01L 2224/82102* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01019* (2013.01); *H01L 2924/01023* (2013.01); *H01L 2924/01024* (2013.01); *H01L 2924/01029* (2013.01); *H01L 2924/01033* (2013.01); *H01L 2924/01046* (2013.01); *H01L 2924/01047* (2013.01); *H01L 2924/01068* (2013.01); *H01L 2924/01072* (2013.01); *H01L 2924/01075* (2013.01); *H01L 2924/01078* (2013.01); *H01L 2924/01079* (2013.01); *H01L 2924/01082* (2013.01); *H01L 2924/10253* (2013.01); *H01L 2924/10271* (2013.01); *H01L 2924/10272* (2013.01); *H01L 2924/10329* (2013.01); *H01L 2924/12044* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/14* (2013.01); *H01L 2924/15192* (2013.01); *H01L 2924/15787* (2013.01); *H01L 2924/19041* (2013.01); *H01L 2924/19105* (2013.01); *H05K 1/05* (2013.01); *H05K 1/188* (2013.01); *H05K 3/4644* (2013.01); *H05K 2201/09745* (2013.01); *H05K 2201/09972* (2013.01); *H05K 2203/0353* (2013.01); *H05K 2203/1469* (2013.01)

(56) References Cited

U.S. PATENT DOCUMENTS

| | | | |
|---|---|---|---|
| 6,498,099 B1 | 12/2002 | McLellan et al. | |
| 6,573,156 B1 | 6/2003 | Wang et al. | |
| 6,734,083 B2 | 5/2004 | Kobayashi | |
| 6,759,723 B2 | 7/2004 | Silverbrook | |
| 6,812,552 B2 | 11/2004 | Islam et al. | |
| 6,833,609 B1* | 12/2004 | Fusaro | H01L 23/3121 257/668 |
| 6,838,299 B2 | 1/2005 | Mulligan et al. | |
| 7,429,772 B2 | 9/2008 | Wilson et al. | |
| 7,563,714 B2 | 7/2009 | Erturk et al. | |
| 7,582,961 B2 | 9/2009 | Chia et al. | |
| 7,880,282 B2* | 2/2011 | Holland | H01L 23/3107 257/678 |
| 7,931,769 B2 | 4/2011 | Kirby | |
| 8,507,320 B2* | 8/2013 | Otremba et al. | 438/113 |
| 2001/0026014 A1 | 10/2001 | Sakamoto et al. | |
| 2005/0231922 A1 | 10/2005 | Chang | |
| 2006/0145328 A1* | 7/2006 | Hsu | H01L 23/5389 257/690 |
| 2006/0145331 A1 | 7/2006 | Cho | |
| 2007/0059863 A1 | 3/2007 | Li et al. | |
| 2007/0278701 A1* | 12/2007 | Chang | H01L 21/481 257/787 |
| 2008/0315412 A1 | 12/2008 | Liang et al. | |
| 2009/0236749 A1* | 9/2009 | Otremba | H01L 23/36 257/774 |

OTHER PUBLICATIONS

Non-Final Office Action mailed Jan. 23, 2012 in U.S. Appl. No. 12/628,428.

Final Office Action mailed Apr. 4, 2012 in U.S. Appl. No. 12/628,428.

* cited by examiner

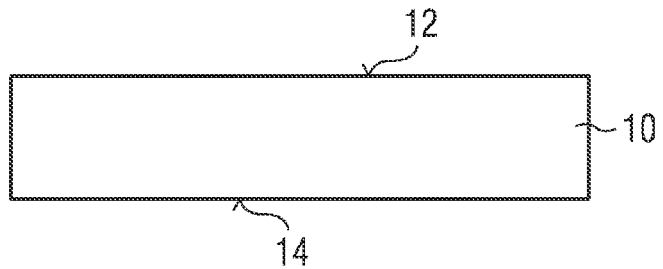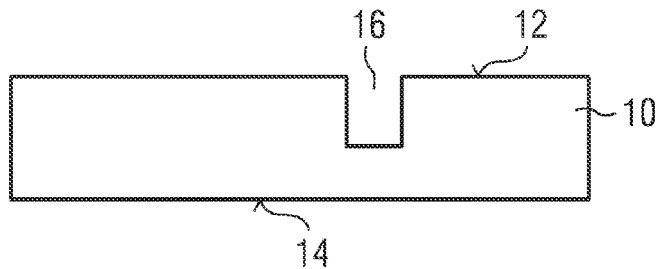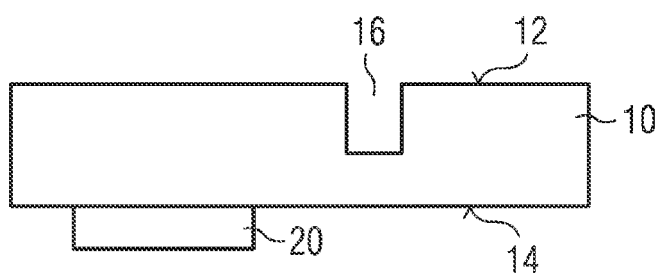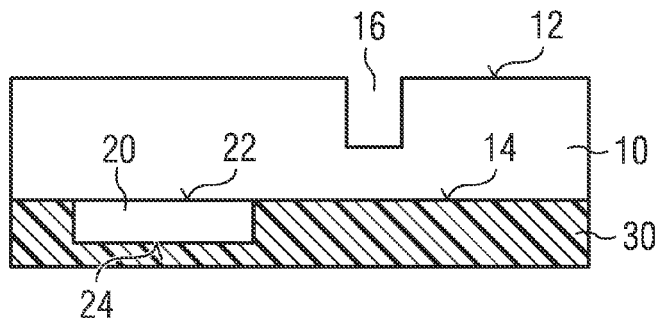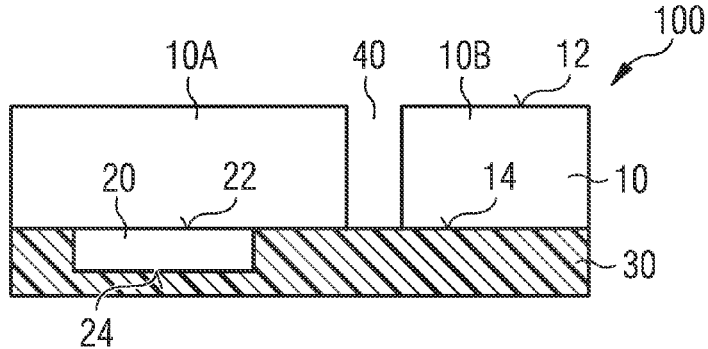

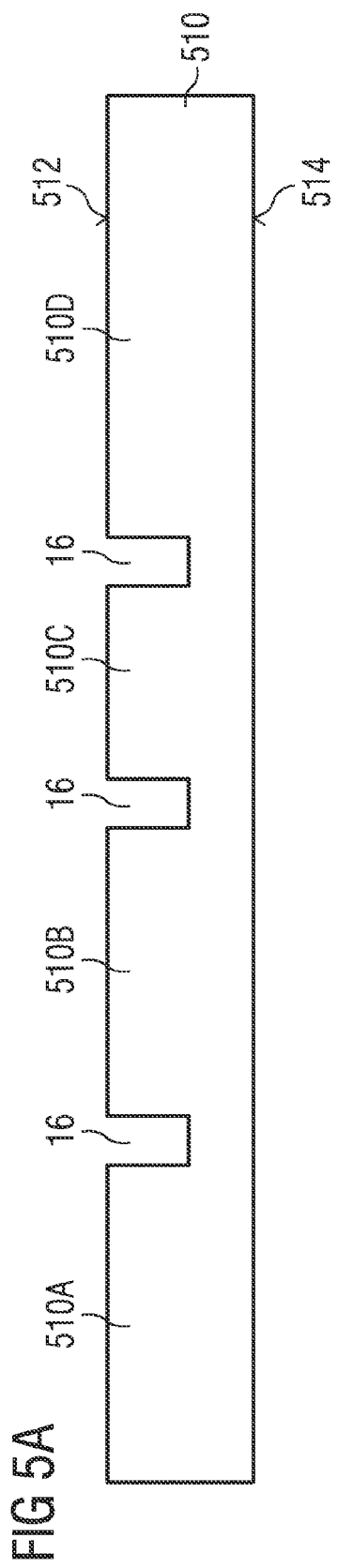
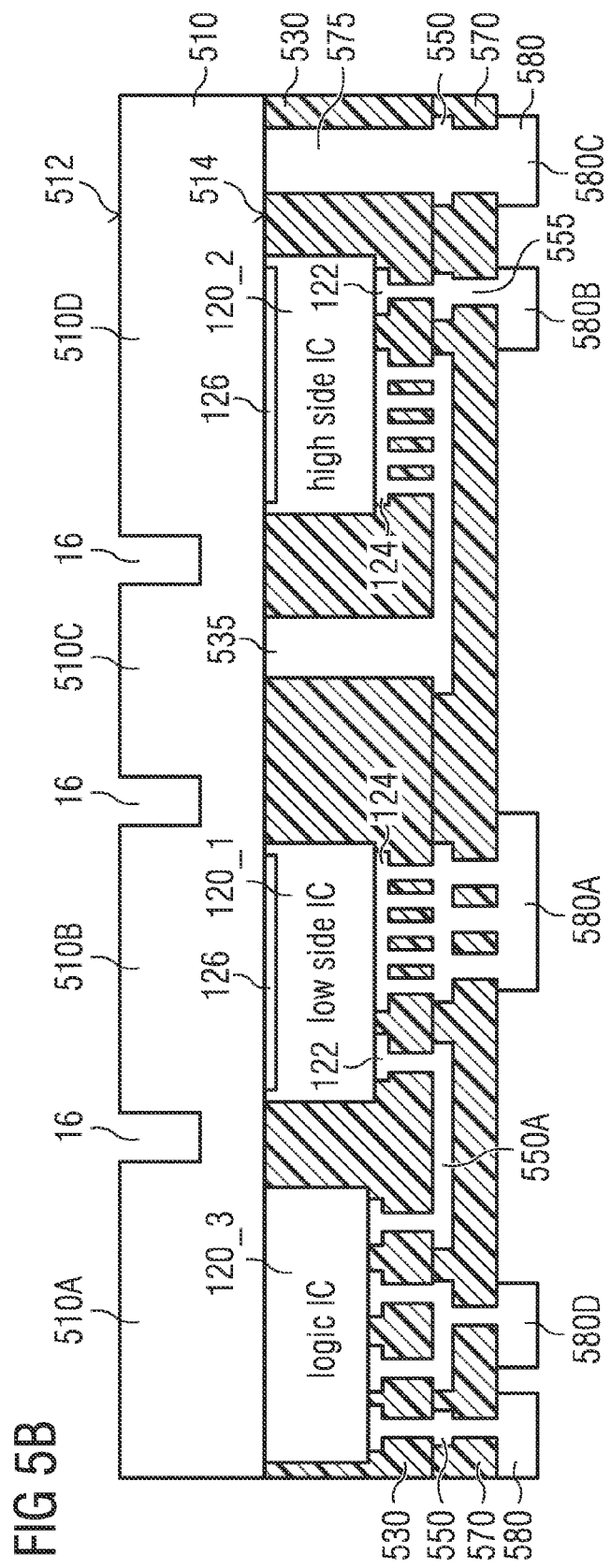

ic device 100.
LAMINATE ELECTRONIC DEVICE

CROSS-REFERENCE TO RELATED APPLICATIONS

This Utility Patent Application is a divisional of U.S. patent application Ser. No. 12/628,428, filed Dec. 1, 2009, which is incorporated herein by reference.

BACKGROUND OF THE INVENTION

The invention relates to electronic devices, and more particularly to the technique of embedding semiconductor components into a laminate.

Embedding semiconductor devices into a laminate has been realized as a promising technology for applications in which size, thickness, costs and weight of electronic devices are sought to be minimized. Such requirements are often encountered in portable applications such as cell-phones, laptop PCs, palms, PDUs (Personal Digital Assistant) etc., and are also of relevance in many other electronic applications such as power devices.

Recently, semiconductor chips have been directly embedded into PCBs (printed circuit boards) and build-up layers of SBU (Sequential Build-Up) laminate substrates. Promising embedded actives technologies should allow for low production costs, an efficient and reliable electrical connection method and high versatility in view of circuit design and routing capability.

For these and other reasons, there is a need for the present invention.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIGS. 1A to 1E are sectional views schematically illustrating one embodiment of a method to produce a laminate electronic device 100.

FIGS. 5A to 5C are sectional views schematically illustrating one embodiment of a method to produce a laminate electronic device 500.

DETAILED DESCRIPTION OF THE INVENTION

Figure 2A:
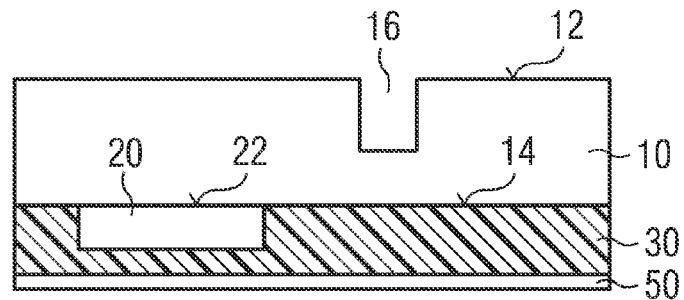
FIGS. 2A to 2D are sectional views schematically illustrating one embodiment of a method to produce a laminate electronic device 200.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. The following description is therefore not to be taken in a limiting sense, and the scope is defined by the appended claims. It should also be noted that the representations of the various layers, sheets or substrates in the Figs. are not necessarily to scale.

In the following detailed description, reference is made to the accompanying drawings, which form a part thereof, and in which is illustrated by way of illustration specific embodiments in which the invention may be practiced. In this regard, directional terminology, such as e.g., "upper", "lower", "top", "bottom", "left-hand", "right-hand", "front side", "backside", etc., is used with reference to the orientation of the Fig.(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical, electro-optical or electro-mechanical circuits and/or passives. The semiconductor chips may, for example, be con-Fig.d as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in one embodiment on its two main surfaces, that is to say on its front side and backside. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include logic integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

Furthermore the semiconductor chips described herein may include electrode pads (or contact pads) on one or more of their outer surfaces wherein the electrode pads serve for electrically contacting the semiconductor chips or circuits integrated in the semiconductor chip. The electrode pads may have the form of lands, i.e. flat contact layers on an outer surface of the semiconductor chip. The electrode pads may be situated on the active main surfaces of the semiconductor chips or on both main surfaces. Any desired metal or metal alloy, for example aluminum, titanium, gold, silver, copper, palladium, platinum, nickel, chromium or nickel vanadium, may generally be used as the material. The metal layers need not be homogenous or manufactured from just one material, that is to say various compositions and concentrations of the materials contained in the metal layers are possible.

One or more semiconductor chips are mounted on a carrier and embedded in at least one electrically insulating layer or in a layer stack to form a laminate electronic device. The electrically insulating layer may have the shape of a foil or sheet, which is laminated on top of the semiconductor chip(s) and the carrier. The foil may be made of a polymer material. In one embodiment, the foil may be made of a polymer material which is coated with a metal layer, e.g., a copper layer (RCC (Resin Coated Copper) foil). Heat and pressure may be applied for a time suitable to attach the polymer foil or sheet to the underlying structure. During lamination, the electrically insulating foil or sheet is capable of flowing (i.e. is in a plastic state), resulting in that gaps between the semiconductor chips or other topological structures on the carrier are filled with the polymer material of the electrically insulating foil or sheet. The electrically insulating foil or sheet may be made of any appropriate duroplastic, thermoplastic or thermosetting material or laminate. In one embodiment, the insulating foil or sheet may be made of a prepreg (short for preimpregnated fibers), that is e.g., made of a combination of a fiber mat, for example glass or carbon fibers, and a resin, for example a duroplastic material. The duroplastic resin may e.g., be made on the basis of an epoxy resin. Prepreg materials are known in the art and are typically used to manufacture PCBs (printed circuit boards). In another embodiment, the insulating foil or sheet may be made of a particle reinforced laminate resin layer. The particles may be made of the same materials as the fibers of a prepreg layer. In one embodiment, the insulating foil or sheet may be made of an unfilled laminate resin layer. As mentioned above, the resin may e.g., be a thermosetting resin. In still another embodiment, the insulating foil or sheet may be made of a thermoplastic material, which melts by application of pressure and heat during lamination and (reversibly) hardens upon cooling and pressure release. Laminate resin layers made of a thermoplastic material may also be unfilled, fiber reinforced or particle reinforced. The thermoplastic material may be one or more materials of the group of polyetherimide (PEI), polyether-sulfone (PES) polyphenylene-sulfide (PPS) or polyamide-imide (PAI).

The carrier on which the semiconductor chip(s) are mounted forms a part of the laminate electronic device. In one embodiment, the carrier may be a metal plate or sheet such as e.g., a leadframe. The metal plate or sheet may have a recess structure or pattern on one of its main surfaces. The recess structure or pattern may include trenches running in the patterned main surface of the carrier. The patterned metal plate or sheet may have a sufficient thickness to be rigid. The semiconductor chip(s) are mounted on a main surface of the structured metal plate. They can either be mounted on the trench-patterned main surface or on the main surface opposite to the trench-patterned main surface. The electrically insulating layer or a layer stack is laminated onto the structured metal plate and the semiconductor chip(s) mounted thereon to form a build-up laminate structure which covers and embeds the semiconductor chip(s).

In other embodiments, the carrier may be made of plastics or ceramics. For instance, the carrier may be made to include a layer of plastics or a layer of plastics coated with a metal layer. By way of example, such carrier may be a single-layer PCB or a multi-layer PCB. The PCB may have at least one insulating layer and a structured metal foil layer attached to the insulating layer. The insulating layer is typically made on the basis of epoxy resin, polythetrafluoroethylene, aramid fibers or carbon fibers and may include reinforcement means such as fiber mats, for example glass or carbon fibers. In other embodiments, the carrier may be made to include a plate of ceramics or a plate of ceramics coated with a metal layer. By way of example, such carrier may be a DCB (direct copper bonded) ceramics substrate.

The recess structure or pattern in one of the main surfaces of the carrier may be generated before the semiconductor chip is attached to the carrier. In this document, the term "recess pattern" means that the cross sectional dimension of the carrier in direction of its thickness is reduced within the recessed regions (e.g., trenches) compared to the non-recessed regions. For instance, the degree of reduction may be within a range of 10% to 80%, more particularly between 30% to 70%. Patterning may be accomplished by various techniques, among them partial etching techniques or conventional machining techniques such as e.g., milling, stamping, sawing.

After attaching the semiconductor chip(s) on the carrier and embedding the semiconductor chip(s) in an insulating layer to form a laminate electronic device, the carrier is separated into a plurality of parts along the pre-fabricated recess pattern (e.g., trenches). Separation may be accomplished by the same techniques as used for pre-structuring, i.e. etching or machining techniques such as e.g., milling or stamping. Further, sawing techniques may be applied.

A variety of different types of laminate electronic devices may be produced by the techniques described herein. By way of example, a laminate electronic device according to one embodiment may constitute a power supply containing one or more power MOSFETs and, optionally, a logic integrated circuit. For instance, the laminate electronic device may include a half-bridge circuitry which may e.g., be implemented in electronic circuits for converting DC voltages, DC-DC converters. DC-DC converters may be used to convert a DC input voltage provided by a battery or rechargeable battery into a DC output voltage matched to the demands of electronic circuits connected downstream.

FIGS. 1A to 1E illustrate process stages of one embodiment of a method of producing a laminate electronic device 100. It is to be noted that the stages of production illustrated in FIGS. 1A to 1E may be understood as simplifications, since further steps may be used which are not depicted in these Figs. For instance, further dielectric layers or structured metal layers may be applied during the assembly of the laminate electronic device 100. Further, electrically conducting vias may be generated in the laminate to electrically connect contact pads of the semiconductor chip to outer terminals of the laminate electronic device 100. Some of the possible variations are explained further below in conjunction with the embodiments illustrated in FIGS. 2A to 2D and 5A to 5C.

According to FIG. 1A, a carrier 10 may be provided. In one embodiment, the carrier 10 may be made of a flat metal plate. The metal may be of copper, aluminum or any other suitable material. In another embodiment, as mentioned above, the carrier 10 may be made of a plastic plate or a ceramic plate.

The carrier 10 has a first main surface 12 and a second main surface 14. According to one embodiment illustrated in FIG. 1B, a depression or recess structure 16 is generated in the first main surface 12 of the carrier 10. The recess structure 16 may have the form of one or more trenches or channels extending in the first main surface 12.

The recess structure 16 may be generated by various techniques. In one embodiment, the recess structure 16 is generated by (partial) etching. Depending on the material of the carrier, various etchants may be used, among them copper chloride (in one embodiment for a carrier made of copper), iron chloride (in one embodiment for a carrier made of iron), HF, NaOH, $HNO_3$, $K_3Fe(CN)_6$ and KI. In this document, etching has a broad meaning, encompassing e.g., etching by the use of liquids and etching by the use of gases or plasmas.

Etching may be accomplished by using a mask for masking the regions of the main surface 12 which are not to be etched. The mask (not illustrated in the figures) may be applied by generating a structured organic mask layer on the first main surface 12 of the carrier 10. The structured organic mask layer may be applied by printing techniques such as e.g., stencil printing, screen printing or ink jet printing. Other techniques for the application of the structured organic mask layer such as e.g., dispensing techniques are also possible. In another embodiment, a continuous layer of an organic material, e.g., a photoresist, may be applied to the first main surface 12 and subsequently structured e.g., by photolithography to produce the structured organic mask layer. For instance, spin coating may be used to apply the continuous layer of organic material. Reel-to-reel processes may be applied for mass production of a band of pre-etched carriers 10.

In another embodiment, the recess structure 16 may be generated by material machining techniques such as e.g., milling or stamping. In one embodiment, if the carrier 10 is made of ceramics, machining techniques such as milling are favorable. Reel-to-reel processes may be applied for mass production of pre-etched carriers 10. Reel-to-reel processes may be applied for mass production of a band of pre-machined carriers 10.

The carrier 10 may have a thickness (distance between the two main surfaces 12 and 14) of about 50 to 2000 μm, more particularly between e.g., 150 and 500 μm. The depth of the recess structure 16 (i.e. the distance from the first main surface 12 to the bottom of the recess structure 16) may be about 10% to 80%, more particularly about 30% to 70% of the thickness of the carrier 10.

According to FIG. 1C, a semiconductor chip 20 is then applied to the second main surface 14 of the carrier 10. The semiconductor chip 20 is placed to a position laterally spaced apart from the recess structure 16, i.e. at a position at which the recess structure 16 extends beyond the outline of the semiconductor chip 20 in a projection normal to the plane of the carrier 10.

The semiconductor chip 20 may be of any type as mentioned above. By way of example, the semiconductor chip 20 may be a vertical semiconductor device, having electrode pads (not illustrated) arranged on its two main surfaces. By way of example, the semiconductor chip 20 may be a power MOSFET, having a drain electrode pad (not illustrated) arranged on a first face 22 of the semiconductor chip 20, the first face 22 facing the carrier 10, and having gate and source electrode pads (not illustrated) arranged on a second face 24 of the semiconductor chip 20, the second face 24 facing away from the carrier 10.

The electrode pad on the first face 22 of the semiconductor chip 20 may be bonded to the carrier 10 by a bond layer (not illustrated) made of a diffusion soldering material such as e.g., AuSn, AgSn, CuSn, AgIn, AuIn, CuIn, AuSi, Sn or Au, or by a paste containing metal particles distributed in a polymer material or resin such as e.g., α-terpineol. Pastes containing metal particles can be, for example, purchased from the companies Coocson Electronic (product name: N 1000), Advanced Nano-Particles (ANP), Harima Chemicals (product names: NPS-H and NHD-1) or NBE Technologies (product name: NBE Tech). The metal particles may, for example, be made of silver, gold, copper, tin or nickel. The extensions (average diameter) of the metal particles may be smaller than 100 nm and, in one embodiment, smaller than 50 nm or 10 nm. These pastes are also referred to as nano pastes in the art. In many cases (e.g., if diffusion soldering or nano paste application is used), an electrically conductive connection is established between the carrier 10 and an electrode pad of the semiconductor chip 20.

In another embodiment, the semiconductor chip 20 may be a chip having no electrode pad on its first face 22, e.g., a logic integrated circuit having all electrode pads arranged on the second face 24. In this case, the bond layer (not illustrated) may be made of the same materials (such as e.g., diffusion solder or nano paste) as mentioned above or may be made of electrically insulating materials such as e.g., polymer adhesives.

As illustrated in FIG. 1D, a first insulating layer 30 is then applied to overlay the carrier 10 and the semiconductor chip 20. In one embodiment, the first insulating layer 30 may be a prepreg (i.e. fiber reinforced) resin layer or a particle reinforced resin layer of uncured resin which is applied under pressure and heat. The first insulating layer 30 may be made of known prepreg materials on the basis of epoxy, polyester or other plastic materials, for instance cotton paper reinforced epoxy, woven glass reinforced epoxy, matte glass reinforced polyester, woven glass reinforced polyester, etc. In another embodiment, the first insulating layer 30 may be made of a thermoplastic material.

The first insulating layer 30 may be a foil which may have about the same lateral dimensions as the carrier 10. During lamination, the foil liquefies and encapsulates the semiconductor chip 20 and/or other topologic structure on the carrier 10. After lamination, the top surface of first insulating layer 30 is substantial flat or planar, i.e. does virtually not reproduce the topology beneath the first insulating layer 30. Thus, the arrangement of the carrier 10 and the semiconductor chip 20 mounted thereon is completely covered by and embedded in the insulating layer 30 free of voids.

The thickness of the semiconductor chip 20 may be less than 100 μm and in one embodiment less than 60 or even 50 or 30 μm. The thickness of the first insulating layer 30 may for instance be less than 200 μm or, in one embodiment, about or less than 100 μm, but may also be greater than these figures.

In a later stage of the manufacturing process, openings or vias may be formed in the top surface of the first insulating layer 30. This will be explained in more detail in conjunction with FIGS. 2A through 2D.

As illustrated in FIG. 1E, the carrier 10 is separated into a plurality of parts 10A and 10B by removing the residual carrier material within the recess structure 16 to generate a slit 40 running through the carrier 10. In other words, the recess structure 16 is deepened to open the second main surface 14 of the carrier 10. This may result in that the parts 10A and 10B become mechanically and electrically disconnected. Generally, at least some of the parts 10A and 10B of the carrier 10 produced that way may become insular, i.e. may become completely separated from surrounding parts of the carrier 10.

Separation of the carrier 10 into parts 10A, 10B may be accomplished by the same techniques as used for the generation of the recess structure 16. These techniques have been described above, and reference is made to this description for the sake of brevity.

By way of example, if etching is used to generate the slit(s) 40, a structured organic mask layer used during pre-structuring of the carrier 10 (cf. FIG. 1B) may be re-used for producing the slit(s). If no structured organic mask layer has been used for structuring the carrier 10, it may also be possible to apply the etchant across the entire first main surface 12 of the carrier 10 until the second main surface 14 of the carrier 10 is opened. In this case, the thickness of the carrier 10 in the regions outwards of the recess structure 16 is reduced to about the same amount as the thickness of the residual carrier material within the recess structure 16 (i.e. by the distance between the bottom of the recess structure 16 and the second main surface 14 of the carrier 10).

FIGS. 2A to 2D illustrate stages of one embodiment of a method of manufacturing a laminate electronic device 200. Without saying, the techniques, materials and methods described above may also be applied to the methods and devices explained further below in conjunction with FIGS. 2A to 2D. In this context, in order to avoid reiteration, reference is made to the description above.

As illustrated in FIG. 2A, the first insulating layer 30 is coated with a first metal layer 50. By way of example, the first insulating layer 30 may be a foil made of a polymer material which is coated with a metal layer, e.g., a copper layer (RCC (Resin Coated Copper) foil). Heat and pressure may be applied for a time suitable to fix this polymer-metal compound foil or sheet to the underlying structure. Except of the first metal layer 50, the structure illustrated in FIG. 2A is similar to the structure illustrated in FIG. 1D, and reference is made to the description of FIGS. 1A to 1D with regard to the materials and the process of fabrication of the structure illustrated in FIG. 2A.

Figure 2B:
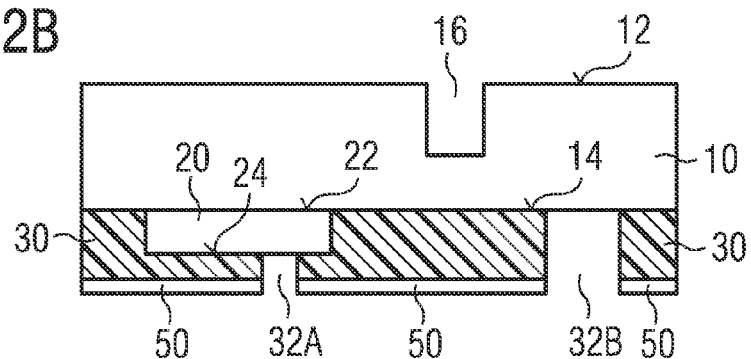

Openings 32A, 32B may be generated in the first insulating layer 30 and the first metal layer 50 for instance by conventional drilling, laser drilling, chemical etching or any other appropriate method. The width of the openings 32A, 32B may, for example, be in the range from 20 to 300 μm. As illustrated in FIG. 2B, an opening 32A may be formed to expose an area of an electrode pad (not illustrated) of the semiconductor chip 20. Opening 32B may e.g., be formed to expose the second surface 14 of the carrier 10. The openings 32A, 32B are referred to as vias (vertical interconnect access) or through-connections in the art.

Figure 2C:
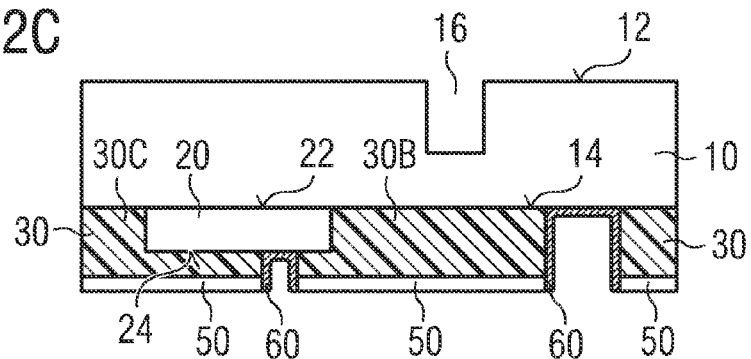

As illustrated in FIG. 2C, the openings 32A, 32B may then be filled by an electrically conductive material 60. For instance, the openings 32A, 32B may be made conductive by galvanic or electroless plating techniques. Further, it is also possible to fill the openings 32A, 32B with a material consisting of a paste containing metal particles. As a result, the electrically conductive material 60 is electrically connected to the first metal layer 50. That way, an electrode pad (not illustrated) on the second face 24 of the semiconductor chip 10 may be contacted up to the first metal layer 50 and may be contacted down to a second part 10B region of the carrier 10. By way of example, the semiconductor chip 20 may be a vertical MOSFET and the electrode pad connected to the carrier 10 may be the source or gate pad of the MOSFET. In that case, the drain electrode pad (not illustrated) of the MOSFET may be contacted down to a first part 10A region of the carrier 10. It is to be noted that the first and second parts 10A, 10B of the carrier 10, as illustrated in FIG. 2D, are still connected at that time by the residual carrier material within the recess structure 16.

Before or after the generation of the openings 32A, 32B or the filling of the openings 32A, 32B, the first metal layer 50 is structured. Structuring may be accomplished by various techniques. For instance, unwanted metal may e.g., be removed by etching or other techniques, leaving only the desired metal traces or lands on the first insulating layer 30. All common subtractive methods such as silk screen printing, photoengraving, PCB milling may be used. Further, it is also possible to use additive processes to pattern the first metal layer 50. In this case, a first insulating layer 30 without a metal coating (i.e. without first metal layer 50) may be used to arrive at a structure as illustrated in FIG. 2C. Additive processes are typically plating processes in which copper or another metal material is plated on the first insulating layer 30 in unmasked areas.

Further, the first metal layer 50 may be reinforced by e.g., galvanic plating before, during or after the filling of the openings 32A, 32B. It is also possible that the first metal layer 50 and the electrically conductive material 60 are applied at the same instant during one and the same deposition step.

Figure 2D:
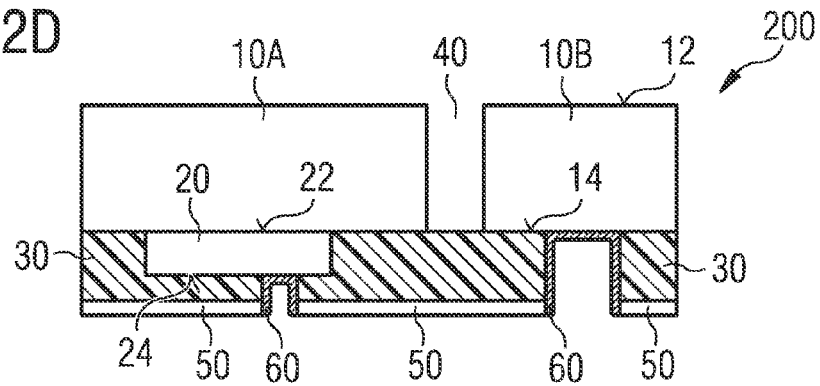

According to FIG. 2D, the carrier 10 is then separated into the first and second parts 10A, 10B. In this context, reference is made to the description of FIG. 1E for the sake of brevity.

FIGS. 3A to 3E illustrate stages of another embodiment of a method of manufacturing a laminate electronic device 300. Without saying, the techniques, materials, dimensions, methods and others described above may also be applied to the methods and devices explained further below. In this context, in order to avoid reiteration, reference is made to the description above.

Figure 3A:
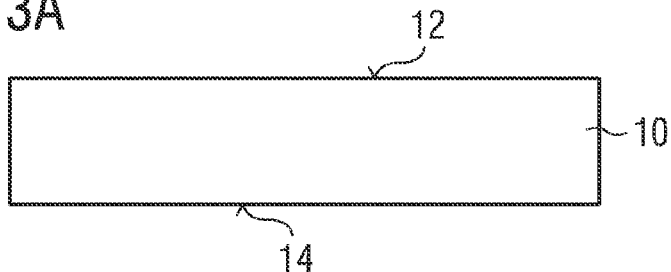
FIGS. 3A to 3E are sectional views schematically illustrating one embodiment of a method to produce a laminate electronic device 300.
Figure 3B:
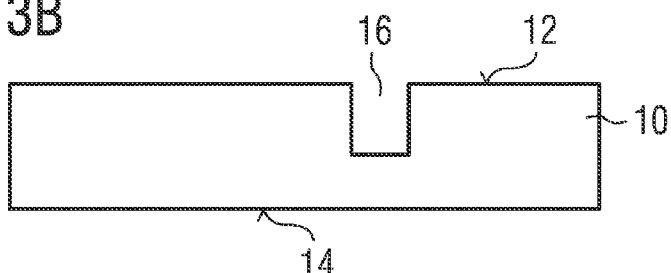
Figure 3C:
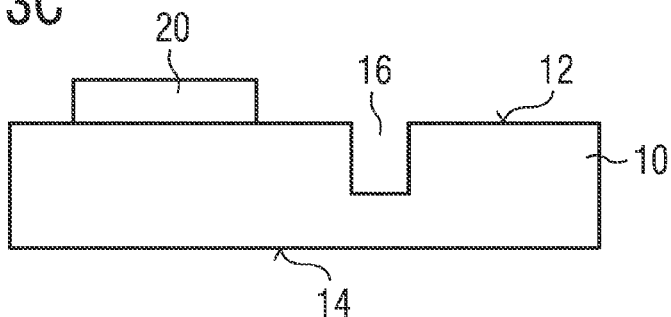

The process steps illustrated in FIGS. 3A and 3B are identical to the corresponding process steps of the first embodiment (FIGS. 1A and 1B). Then, according to FIG. 3C, the semiconductor chip 20 is attached to the first main surface 12 of the pre-structured carrier 10.

Figure 3D:
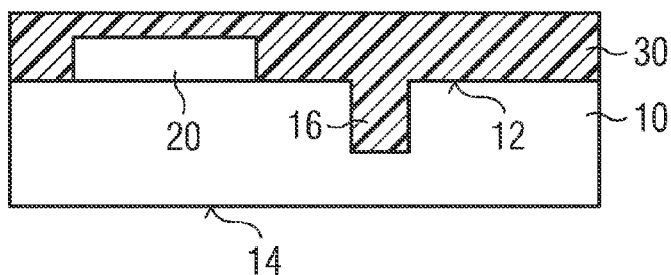

As illustrated in FIG. 3D, the first insulating layer 30 is then applied to overlay the carrier 10 and the semiconductor chip 20. In this embodiment, the first insulating layer 30 is laminated onto the first main surface 12 of the pre-structured carrier 10. Again, as already mentioned above, the first electrically insulating layer 30 may have the shape of a foil or sheet and may be made of a polymer material. During lamination, the electrically insulating foil or sheet is flowing, resulting in that the recess structure 16 and gaps between semiconductor chips 20 or other topological structures on the carrier 10 are filled with the polymer material of the first electrically insulating layer 30.

Figure 3E:
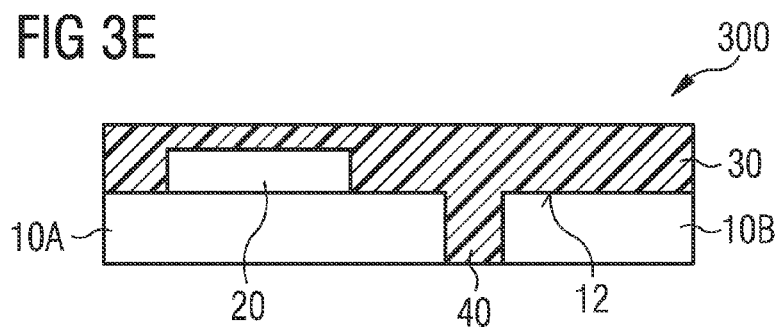
Figure 4A:
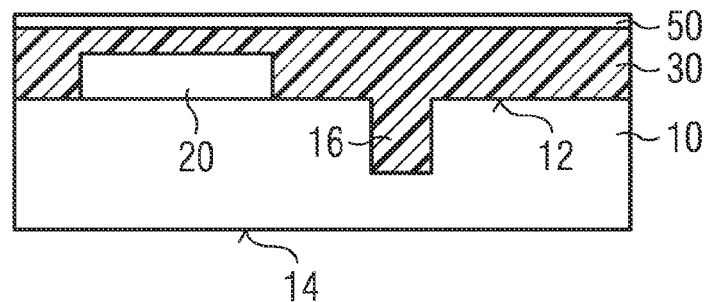
FIGS. 4A to 4D are sectional views schematically illustrating one embodiment of a method to produce a laminate electronic device 400.
Figure 4B:
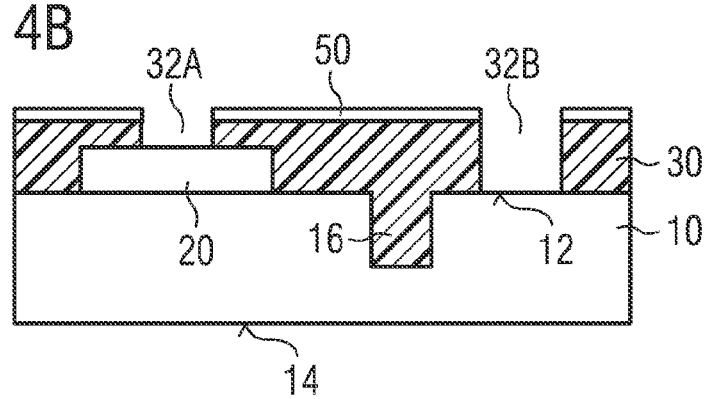
Figure 4C:
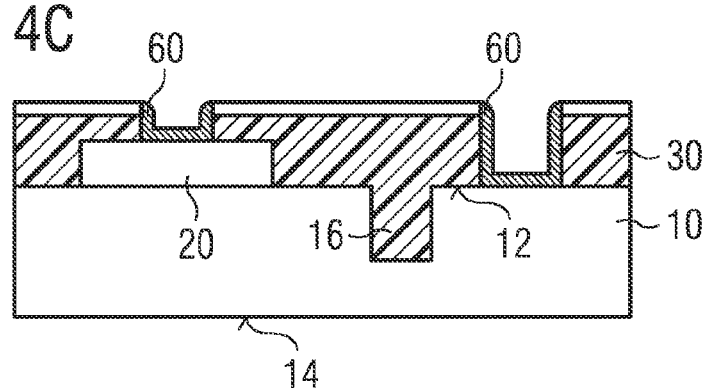
Figure 4D:
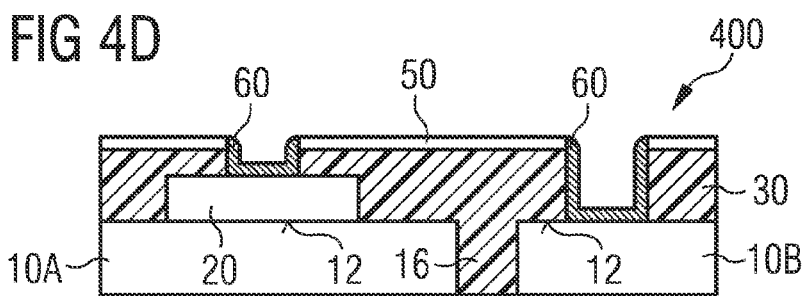

As illustrated in FIG. 3E, the carrier 10 is then separated into two carrier parts 10A and 10B. Separation is performed by removing the residual carrier material within the recess structure 16. This may be carried out by etching the entire second main surface 14 of the carrier 10 until the etched second main surface 14 reaches the recess structure 16 which then penetrates the carrier 10 as a slit 40. That way, the thickness of the carrier 10 at any cross sectional position may be reduced by about the same amount. In one embodiment, it is also possible that carrier material is only removed at the recess structure 16. In this case, another recess structure (not illustrated) is generated at the second main surface 14 of the carrier 10 opposite to the recess structure 16 to connect to the recess structure 16 and to form a slit 40. The other recess structure may be formed by the same techniques as mentioned above for generating the recess structure 16.

FIGS. 4A to 4D illustrate manufacturing stages of one embodiment of a method of manufacturing a laminate electronic device 400. Similar to the embodiment illustrated in FIGS. 2A to 2D, the embodiment illustrated in FIGS. 4A to 4D illustrates the introduction of openings or vias 32A, 32B in the first insulating layer 30. Further, still similar to FIGS. 2A to 2D, the first insulating layer 30 is (optionally) equipped with a metal coating referred to as a first metal layer 50. Again, techniques, materials, dimensions, methods and others described above may be applied to the methods and devices illustrated in FIGS. 4A to 4D, and reference is made to the description above in order to avoid reiteration.

In all embodiments, the recess structure 16 of the carrier 10 may be used as an alignment mark in subsequent processing steps. By way of example, the die attach step (FIGS. 1C and 3C) may use the recess structure 16 for aligning the relative position of the carrier 10 to the semiconductor chip(s) 20 to be mounted onto the carrier 10.

Figure 5C:
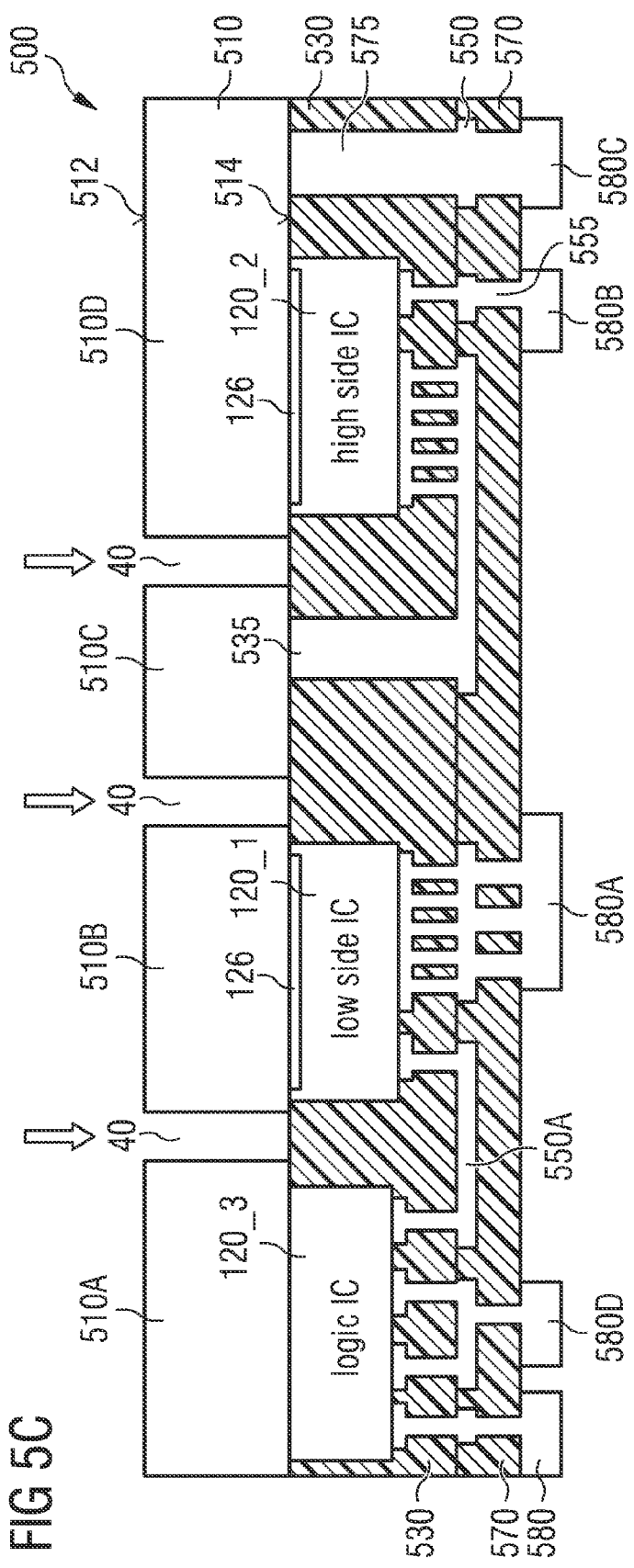

A further laminate electronic device 500 and a method of manufacturing the same according to one embodiment is illustrated in FIGS. 5A through 5C. The laminate electronic device 500 implements a half-bridge circuitry of e.g., a DC-DC voltage converter.

According to FIG. 5A, a carrier 510, which corresponds to carrier 10 of the aforementioned embodiments, includes a recess structure 16. The recess structure 16 predefines four parts 510A, 510B, 510C, 510D of the carrier 510 which correspond to parts 10A and 10B in FIGS. 1A through 4D. As mentioned above, the carrier 510 may be made of a patterned metal sheet or plate 514, e.g., a leadframe, or may be made of an insulating layer of e.g., plastics, ceramics, etc. coated with a metal layer.

Semiconductor chips 120_1, 120_2 and 120_3 are mounted on the carrier 510. The first and second semiconductor chips 120_1 and 120_2 may be power MOSFETs, and the third semiconductor chip 120_3 may be a logic IC. The first semiconductor chip 120_1 is attached to a second surface 514 of carrier 510 at the part 510B thereof, the second semiconductor chip 120_2 is attached to the second surface 514 of carrier 510 at the part 510D thereof, and the third semiconductor chip 120_3 is attached to the second surface 514 of carrier 510 at the part 510A thereof. The arrangement of the carrier 510 and the semiconductor chips 120_1, 120_2 and 120_3 corresponds to the arrangement the carrier 10 and semiconductor chip 20 illustrated in FIGS. 1A through 2D, and reference is made to the corresponding description.

Then, e.g., two build-up insulating layers 530, 570 are laminated onto the carrier 510 and the semiconductor chips 120_1, 120_2, 120_3. Both insulating layers 530, 570 may be made of the same materials and may be processed according to the same methods as described above with reference to the foregoing embodiments. Similar to the first insulating layer 30, the first insulating layer 530 may be a prepreg or particle reinforced resin layer coated with a first structured metal layer 550 (which corresponds to the first metal layer 50—reference is made to the description of this layer). However, in this embodiment, the first structured metal layer 550 is an internal metal layer. The second insulating layer 570 overlays the first structured metal layer 550 and may likewise be provided by a prepreg or particle reinforced resin layer. It forms a support for a second structured metal layer 580 which may form external terminals of the laminate electronic device 500 and/or may form conductor traces leading to external terminals of the laminate electronic device 500. The first and second structured metal layers be generated on the first and second insulating layers 530, 570 by using any subtractive or additive process known in the art or described above.

Both semiconductor chips 120_1 and 120_2 may be vertical power devices. By way of example, a gate electrode pad 122 of the first semiconductor chip 120_1 may be electrically connected via a trace 550A of the first structured metal layer 550 to an electrode pad of the third semiconductor chip 120_3, a source electrode pad 124 of the first semiconductor chip 120_1 may be electrically connected to a terminal pad 580A formed by the second structured metal layer 580, and a drain electrode pad 126 of the first semiconductor chip 120_1 may be electrically connected to the part 510B of the carrier 510. Referring to the second semiconductor chip 120_2, a drain electrode pad 126 may be electrically connected to the part 510D of the carrier 510, a source electrode pad 124 may be electrically connected to the part 510C of the carrier 510 via a first through-connection 535 connecting down through the first insulating layer 530 to the first structured metal layer 550, and a gate electrode pad 122 may be electrically connected via a second through-connection 555 to a terminal pad 580B formed by the second structured metal layer 580. Further, a terminal pad 580C is formed by the second structured metal layer 580 and is connected down to the part 510D of the carrier 510 via a third through-connection 575 running through the first and second insulating layers 530, 570. The third semiconductor chip 120_3 may be a logic IC. As illustrated in FIG. 5B, at least some of the electrode pads of the third semiconductor chip 120_3 may be electrically connected to a terminal pad 580D formed by the second structured metal layer 580.

As illustrated in FIG. 5C, the parts 510A, 510B, 510C, 510D of the carrier 510 are then separated along the recess structure 16. This can be done by any of the aforementioned processes, in one embodiment by a local (i.e. masked) or global (i.e. non-masked) etch process. As a result, slots 40 extending from the first to the second main surfaces 512, 514 of the carrier 510 are formed in the carrier 510.

It is to be noted that some of the parts 510A, 510B, 510C, 510D may remain electrically connected by virtue of the specific pattern of the slits 40, whereas other parts 510A, 510B, 510C, 510D may become electrically disconnected. For instance, the parts 510B and 510C remain electrically connected (which is not visible in the section illustrated in FIG. 5C). Thus, terminal pads 580A, 580C may form the I/O terminals of the laminate electronic device 500, between which the two power MOSFETs 120_1, 120_2 are arranged in series and implement two switches which are controlled by the logic IC 120_3. The laminate electronic device 500 may represent a half-bridge circuitry. The terms "low side" and "high side" of the power MOSFETs 120_1, 120_2 refer to this known circuitry.

The laminate electronic device 500 may be mounted on a device carrier (not illustrated) such as e.g., a customer's PCB. To this end, the terminal pads 580A, 580B, 580C, 580D are placed opposite to mounting areas of the device carrier and are bonded to carrier pads on the device carrier by soldering or any other electrical bonding approach.

Figure 6A:
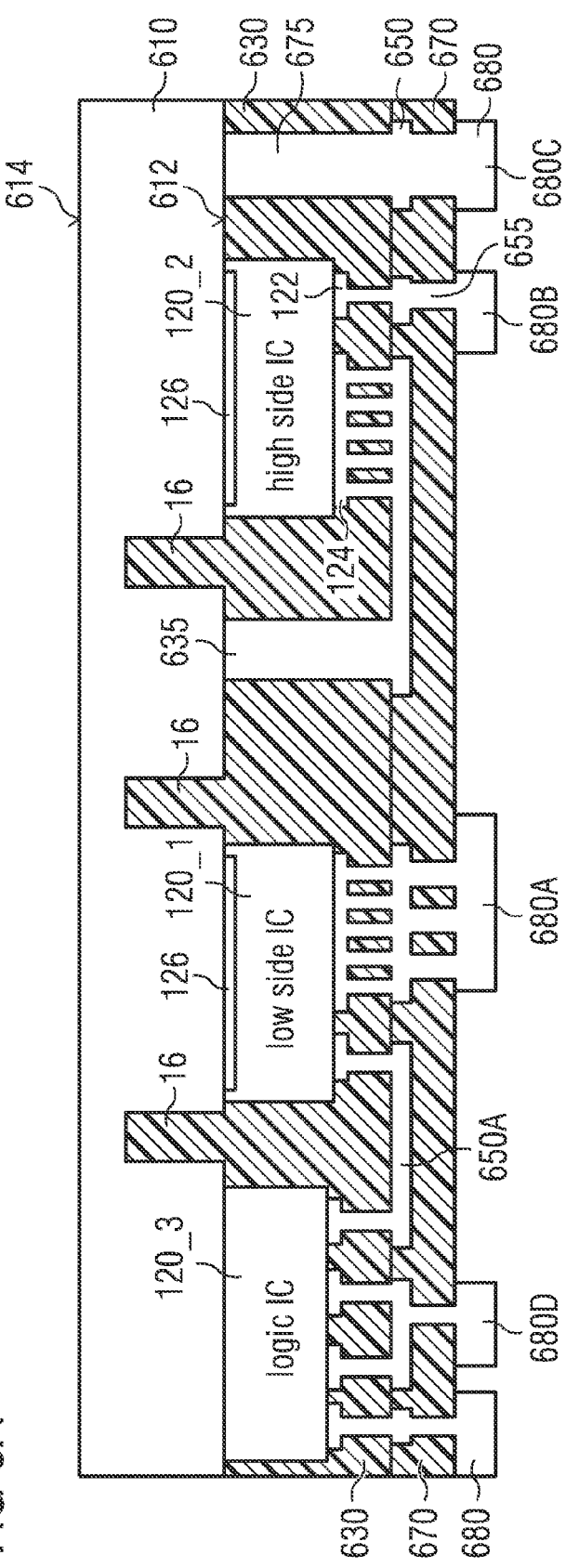
FIGS. 6A and 6B are sectional views schematically illustrating one embodiment of a method to produce a laminate electronic device 600.
Figure 6B:
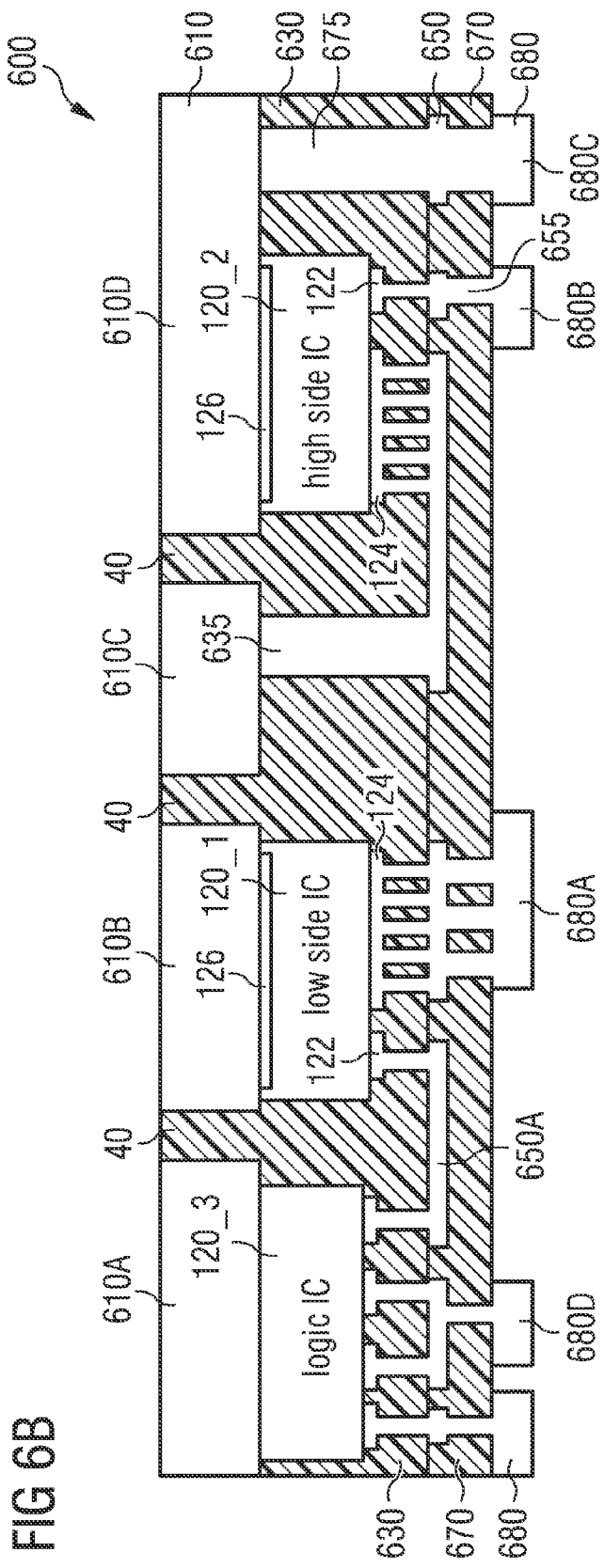

FIGS. 6A and 6B illustrate one embodiment of a laminate electronic device 600 and a method of manufacturing the same. Similar to the laminate electronic device 500, the laminate electronic device 600 implements a half-bridge circuitry of e.g., a DC-DC voltage converter.

According to FIG. 6A, a carrier 610, which corresponds to carrier 10 of the aforementioned embodiments, includes a recess structure 16. The recess structure 16 may have been produced as described above. The recess structure 16 defines four parts 610A, 610B, 610C, 610D of the carrier 610. The carrier 610 may be identical to carrier 510 illustrated in FIGS. 5A to 5B.

Semiconductor chips 120_1, 120_2 and 120_3 are mounted on the carrier 610. The semiconductor chips 120_1, 120_2 and 120_3 may be of the same type as explained above in conjunction with the embodiment illustrated in FIGS. 5A to 5C. However, different to this embodiment, the semiconductor chips 120_1, 120_2 and 120_3 are mounted on the first main surface 612 (which corresponds to the first main surface 512 in FIGS. 5A to 5C) rather than on the second main surface 614 (which corresponds to the second main surface 514 in FIGS. 5A to 5C) of the carrier 610. This arrangement is similar to the arrangement illustrated in FIGS. 3A through 4D, and reference is made to the description of the embodiments illustrated in these figures.

After the semiconductor chips 120_1, 120_2 and 120_3 are mounted on the carrier 610, two built-up insulating layers 630, 670 are laminated onto the first main surface 612 of the carrier 610 and the semiconductor chips 120_1, 120_2, 120_3. The insulating layers 630, 670 may be identical to the insulating layers 530, 570 to which reference is made for the sake of brevity.

Further, a circuitry to interconnect the semiconductor chips 120_1, 120_2 and 120_3 and terminal pads is formed from a first structured metal layer 650 and a second structured metal layer 680 the same way as explained above with reference to the first structured metal layer 550 and the second structured metal layer 580 of the aforementioned embodiment. Thus, the parts denoted by the reference signs 680A to 680D, 650A, 635, 655, 675 correspond to the parts denoted by reference signs 580A to 580D, 550A, 535, 555 and 575, respectively, of the embodiment illustrated in FIGS. 5A through 5C.

As illustrated in FIG. 6B, the parts 610A, 610B, 610C, 610D of the carrier 610 are then separated along the recess structure 16. This can be done by any of the aforementioned processes, in one embodiment by a global (i.e. non-masked) or a local (i.e. masked) etch process. In FIG. 6B, by way of example, a global etch process is used and reference is made to the corresponding description in conjunction with the embodiments illustrated in FIGS. 3E and 4D. Again, the parts 610B and 610C may remain electrically connected during the carrier separation process.

In all embodiments, the carriers 10, 510, 610 may additionally serve as a heat sink and/or a mounting platform for additional passives such as capacitors, inductors, resistors or active components. The semiconductor chips 20, 120_1, 120_2, 120_3 as well as the internal first structured metal layer 550, 650 may be completely embedded in and covered by the laminate such that only terminals 60, 580A-D, 680A-D and the parts 10A, 10B, 510A-D, 610A-D of the carrier 10, 510, 610 are exposed at the laminate electronic device package and available for external use.

Figure 7A:
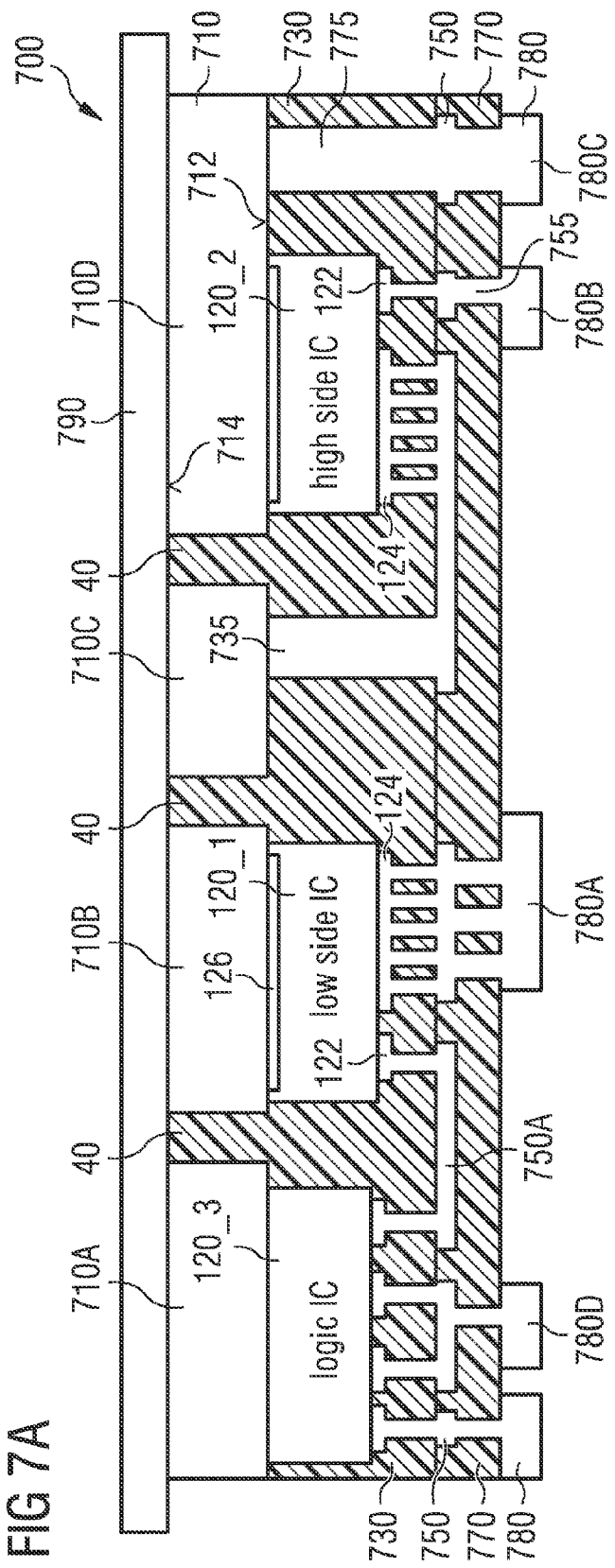
FIGS. 7A and 7B are sectional views schematically illustrating one embodiment of a method to produce a laminate electronic device 700.
Figure 7B:
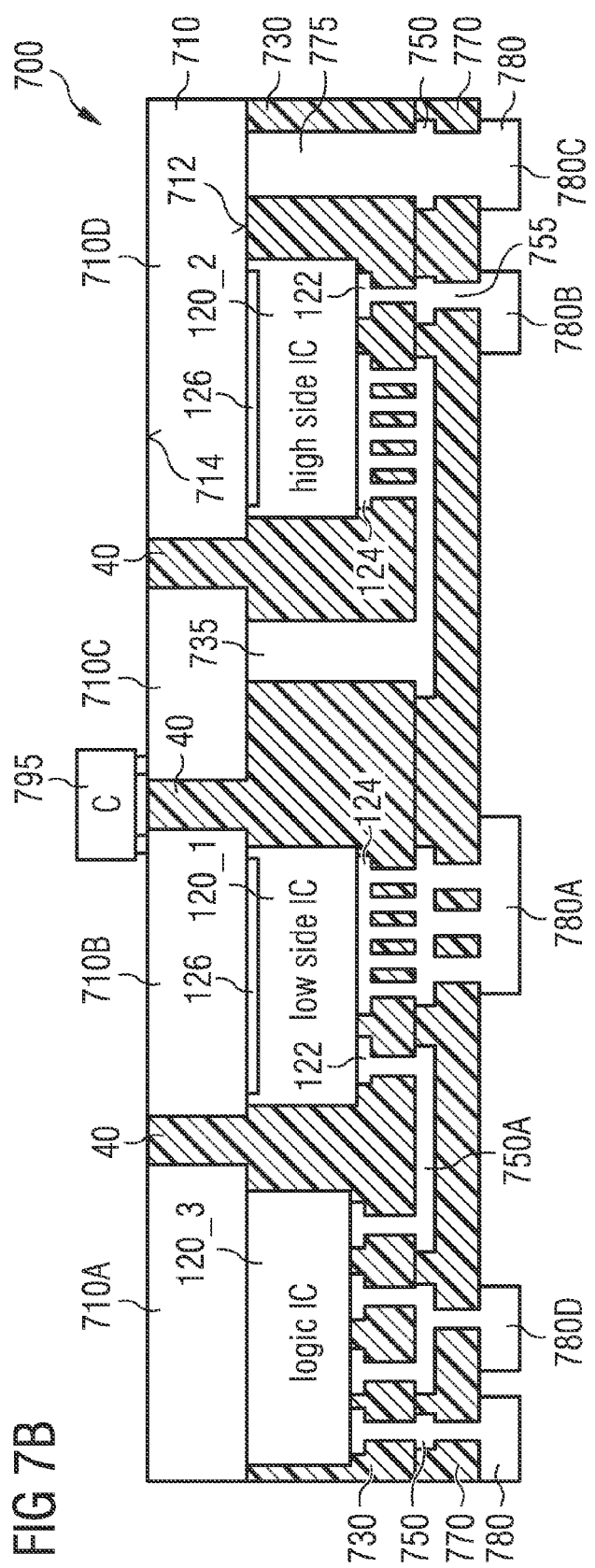

FIGS. 7A and 7B illustrate one embodiment of a laminate electronic device 700 and stages of a method of manufacturing the same. Identical reference signs and reference signs with identical last two digits throughout the embodiments relate to similar parts, and reference is made to the description above for the sake of brevity. In FIG. 7A, a temporary foil 790 has been attached to the second main surface 714 of the carrier 710. At that time, the carrier 710 may still be a non-structured plate or sheet as illustrated in FIG. 3A and denoted by reference sign 10.

In a subsequent process, slits 40 are produced in the carrier 710. The slits 40 extend from the first main surface 712 of the carrier 710 to the second main surface 714 of the carrier 710. At the second main surface 714, the slits 40 are covered by the temporary foil 790. The slits 40 may be produced by any of the aforementioned methods (e.g., by applying a structured mask layer on the first main surface 712 and applying an etchant to that surface) and the carrier 710 may be of any type as described before.

Subsequently, the semiconductor chips 120_1, 120_2 and 120_3 are mounted on the first main surface 712 of the carrier 710. In one embodiment, the mounting of the semiconductor chips 120_1, 120_2 and 120_3 may be accomplished before the generation of the slits 40.

Then the first and second insulating layers 730, 770 are laminated on the semiconductor chips 120_1, 120_2, 120_3 and the first main surface 712 of the carrier 710. During lamination, the slits 40 are filled with insulating polymer material.

In a next step, the circuitry including the first and second structured metal layers 750, 780 and the through-connections 735, 755 and 775 is established as described in conjunction with the embodiments above.

Finally, the temporary foil 790 is removed from the laminate electronic device 700. As a result, a laminate electronic device 700 which is similar to the laminate electronic device 600 is produced, cf. FIG. 7B.

Further, FIG. 7B illustrates that the second main surface 714 structured by the slits 40 may be used as a mounting platform for additional passive or active components 795. By way of example, a capacitor C is placed on the second main surface 714 to make contact to part 710B of the carrier 710 and to part 710C of the carrier 710.

Recesses 16 and slits 40 generated by etching a carrier made of a metal plate can be clearly distinguished from recesses or slits fabricated by other machining techniques such as e.g., stamping, sawing or milling. One characteristic of such etched structures are rounded edges, which are not produced by conventional machining techniques as recited above. Further, the edges of recesses or slits generated by using an etchant are free of flashes, which is not the case if such structures are fabricated by e.g., stamping, sawing or milling techniques.

Further, slits or recesses which have been produced by the application of an etchant typically show a characteristic wall structure. The roughness of the wall is significantly larger than the roughness of a wall which has been generated by conventional machining techniques such as e.g., stamping, sawing or milling. By way of example, the application of an etchant typically causes the walls of the etched slits to have a mean roughness of more than 1.0 μm.

Figure 8:
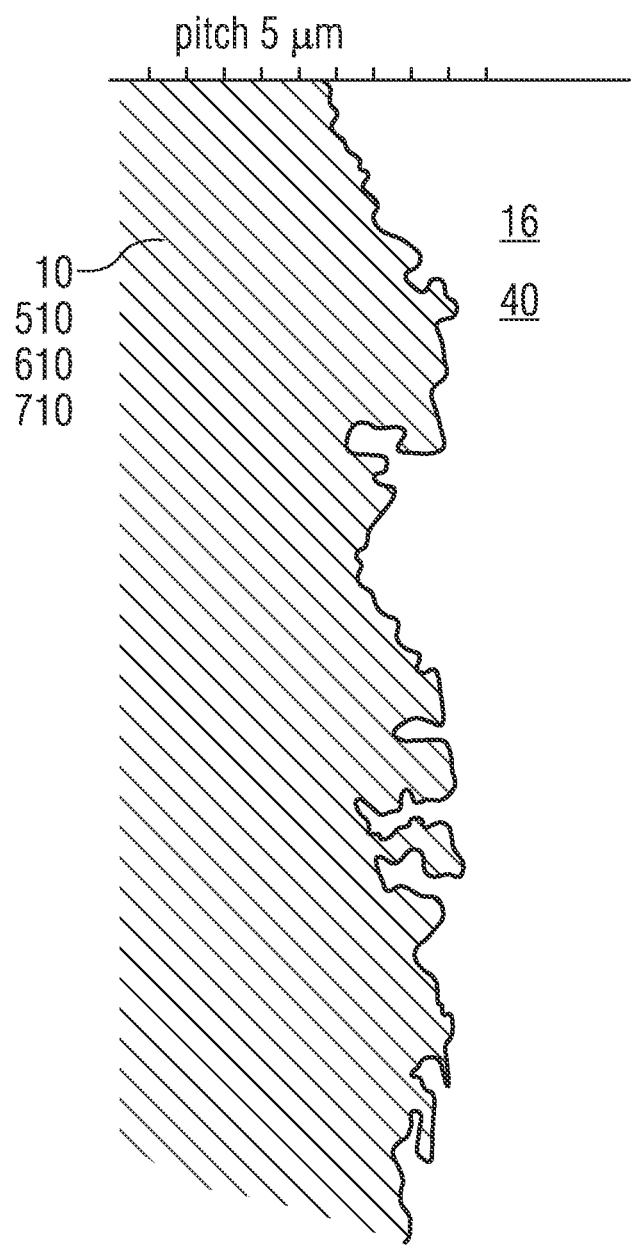
FIG. 8 is a microscope image of a sectional view of a wall of a recess or slit in a carrier made of metal, wherein the recess or slit is generated by an etching process.

FIG. 8 illustrates an REM (reflection electron microscope) image of a sectional view of a wall of a recess 16 or slit 40 which has been produced by applying an etchant to a carrier made of metal (e.g., a copper plate). The pitch of the scale is 5.0 μm. As can be seen, the mean roughness of the wall is significantly greater than 1.0 μm. In summery, the method of manufacturing (i.e. etching) of an etched slit or recess can clearly be identified by investigations.

Etching the recess pattern 16 and/or the slits 40 is a versatile approach because it provides the possibility to create flexible slit pattern designs, and the full slit pattern can be generated at the same instant, i.e. in parallel. Further, it is comparatively easy to perform a two step process (first producing the recess structure 16, then the slit structure 40). This two step process allows to laminate one or more insulating layers 30, 50, 530, 550, 630, 650, 730, 750 onto the carrier 10, 510, 610, 710 without squeezing the polymer material of the insulating layer through slits 40 in the carrier 10, 510, 610, 710 out of the device, because carrier separation (i.e. the generation of slits 40) is only performed after the lamination process.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. By way of example, the different carriers 110 (e.g., double-sided PCB), 410 (e.g., single-sided PCB), 510 (e.g., leadframe), 610 (e.g., leadframe filled with polymer) may be combined with any circuitry or laminate layer stack disclosed in the various embodiments. Furthermore, to the extent that the terms "include", "have", "with", or other variants thereof are used in either the detailed description or the claims, such terms are intended to be inclusive in a manner similar to the term "include". Furthermore, it should be understood that embodiments of the invention may be implemented in discrete circuits, partially integrated circuits or fully integrated circuits or programming means. Also, the term "embodiment" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A laminate electronic device, comprising:
a carrier comprising a first main surface and a second main surface opposite to and facing away from the first main surface, the carrier separated into a plurality of parts via a pattern of slits extending from the first main surface to the second main surface of the carrier;
a first semiconductor chip attached directly to the second main surface of a first part of the carrier such that an electrode pad of the first semiconductor chip faces the carrier; and
a first electrically insulating layer overlying the second main surface of the carrier and the first semiconductor chip, and extending into the pattern of slits,
wherein the first semiconductor chip is arranged outside the carrier and outside the pattern of slits extending from the first main surface to the second main surface of the carrier.

2. The laminate electronic device of claim 1, wherein the pattern has rounded edges.

3. The laminate electronic device of claim 1, wherein the edges of the pattern are free of flashes.

4. The laminate electronic device of claim 1, wherein the pattern has walls illustrating a mean roughness of at least 1.0 μm.

5. The laminate electronic device of claim 1, further comprising:
a first structured metal layer extending over the first insulating layer; and
a first through-connection extending from the first structured metal layer to an electrode pad on an upper face of the first semiconductor chip facing away from the carrier.

6. The laminate electronic device of claim 1, further comprising:
a second insulating layer extending over the first insulating layer;
a second structured metal layer extending over the second insulating layer; and
a second through-connection extending from the second structured metal layer to the carrier.

7. The laminate electronic device of claim 1, further comprising:
a second semiconductor chip attached on the main surface of the carrier on which the first semiconductor chip is attached.

8. The laminate electronic device of claim 1, wherein the first semiconductor chip is a vertical device.

9. The laminate electronic device of claim 1, wherein due to the pattern, the plurality of parts includes parts that are electrically connected to each other and parts that are electrically disconnected from each other.

10. A laminate electronic device, comprising:
a carrier comprising a first main surface and a second main surface opposite to and facing away from the first main surface, the carrier separated into a plurality of parts via a pattern of slits formed in the first main surface of the carrier;
a first semiconductor chip attached directly to the second main surface of a first part of the carrier such that an electrode pad of the first semiconductor chip facing the carrier is electrically coupled to the carrier;
a first electrically insulating layer overlying the second main surface of the carrier and the first semiconductor chip and extending into the pattern of slits; and
a second semiconductor chip attached directly to the second main surface of a second part of the carrier,
wherein the first semiconductor chip is arranged outside the pattern of slits formed in the first main surface of the carrier.

11. The device of claim 10, further comprising:
a third semiconductor chip attached to one of the first and second main surface of a third part of the carrier, wherein the first and second semiconductor chips are power MOSFETs, and the third semiconductor chip is a logic IC.

12. The device of claim 10, comprising:
the first insulating layer is a fiber reinforced thermoset resin layer or a particle reinforced thermoset resin layer or an unfilled laminate thermoset resin layer or a filled or unfilled thermoplastic resin layer laminated on the main surface of the carrier on which the first semiconductor chip is attached and on the first semiconductor chip.

13. The device of claim 10, comprising:
a first structured metal layer positioned over the first insulating layer; and
at least a first through-connection extending from the first structured metal layer to an electrode pad on an upper face of the first semiconductor chip facing away from the carrier.

14. The device of claim 10, further comprising:
a first structured metal layer over the first insulating layer; and
at least a second through-connection extending from the first structured metal layer to the carrier.

15. The device of claim 10, further comprising:
a second insulating layer comprising a fiber reinforced thermoset resin layer or a particle reinforced thermoset resin layer or an unfilled laminate thermoset resin layer or a filled or unfilled thermoplastic resin layer laminated on the first insulating layer.

16. The device of claim 15, further comprising:
a second structured metal layer over the second insulating layer.

17. A laminate electronic device, comprising:
a carrier comprising a first main surface and a second main surface opposite to and facing away from the first main surface, the carrier separated into a plurality of parts via a pattern of slits formed in the first main surface of the carrier;
a first semiconductor chip attached directly to the second main surface of a first part of the carrier such that an electrode pad of the first semiconductor chip faces the carrier;
a first electrically insulating foil laminated over the second main surface of the carrier and over the first semiconductor chip, and extending into the pattern of slits, to form a first electrically insulating layer; and wherein
the plurality of parts remain coupled together via the first electrically insulating layer, and
wherein the first semiconductor chip is arranged outside the carrier and outside the pattern of slits formed in the first main surface of the carrier.

18. The device of claim 17, wherein the first electrically insulating foil comprises a fiber reinforced thermoset resin foil or a particle reinforced thermoset resin foil or an unfilled laminate thermoset resin foil or a filled or unfilled thermoplastic resin foil laminated over the main surface of the carrier on which the first semiconductor chip is attached and over the first semiconductor chip.

19. The device of claim 17, further comprising:
a first structured metal layer positioned over the first electrically insulating layer; and
a first through-connection extending from the first structured metal layer to an electrode pad on a face of the first semiconductor chip facing away from the carrier.

20. The device of claim 17, further comprising:
a first structured metal layer over the first electrically insulating layer; and
a first through-connection extending from the first structured metal layer to the carrier.

* * * * *